United States Patent
Anglin et al.

(10) Patent No.: US 12,296,765 B2
(45) Date of Patent: *May 13, 2025

(54) ELECTRICAL ASSEMBLY

(71) Applicant: Lear Corporation, Southfield, MI (US)

(72) Inventors: Aric Anglin, Rives Junction, MI (US); Ajmal Ansari, Canton, MI (US); Greg Dickerhoof, Ann Arbor, MI (US); Robert M. Schmidt, Livonia, MI (US); Rutunj Rai, Canton, MI (US); Hongen Tu, San Francisco, CA (US)

(73) Assignee: Lear Corporation, Southfield, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/521,421

(22) Filed: Nov. 28, 2023

(65) Prior Publication Data
US 2024/0092291 A1  Mar. 21, 2024

Related U.S. Application Data

(63) Continuation of application No. 17/495,131, filed on Oct. 6, 2021, now Pat. No. 11,858,437, which is a continuation-in-part of application No. 17/395,082, filed on Aug. 5, 2021, now Pat. No. 11,558,963, which is a continuation-in-part of application No. 17/223,738, filed on Apr. 6, 2021, now Pat. No. 11,721,956, which is a continuation-in-part of
(Continued)

(51) Int. Cl.
*H02B 1/20* (2006.01)
*B60R 16/03* (2006.01)
*H01H 50/04* (2006.01)
*H01H 50/14* (2006.01)
*H01R 13/08* (2006.01)
*H05K 5/00* (2006.01)
*H02B 1/56* (2006.01)

(52) U.S. Cl.
CPC ........... *B60R 16/03* (2013.01); *H01H 50/047* (2013.01); *H01H 50/14* (2013.01); *H01R 13/08* (2013.01); *H02B 1/20* (2013.01); *H05K 5/0091* (2013.01); *H02B 1/56* (2013.01)

(58) Field of Classification Search
CPC ... H02B 1/18; H02B 1/20; H02B 1/21; H02G 5/10
See application file for complete search history.

(56) References Cited

U.S. PATENT DOCUMENTS 6,087,800 A * 7/2000 Becker ................. H05K 7/1432
                                              318/370
6,351,113 B1 * 2/2002 Becker ..................... H02P 1/16
                                              324/207.2
(Continued)

*Primary Examiner* — Harshad C Patel
(74) *Attorney, Agent, or Firm* — Fishman Stewart PLLC

(57) ABSTRACT

An electrical assembly may include a bus bar assembly, a sensor assembly, including a circuit board connected to the bus bar assembly, and a sensor, a bracket connected to the bus bar assembly, and a cooling member connected to the bracket. A method of assembling an electrical assembly may include connecting a shunt resistor with a bus bar assembly, connecting a circuit board with the bus bar assembly, connecting the bus bar assembly with the bracket, disposing the cooling member on or about the bracket, and/or connecting the cooling member with the bracket.

20 Claims, 16 Drawing Sheets

Related U.S. Application Data application No. 17/071,588, filed on Oct. 15, 2020, now Pat. No. 11,547,024, and a continuation-in-part of application No. 16/592,126, filed on Oct. 3, 2019, now Pat. No. 10,971,873.

(60) Provisional application No. 62/915,568, filed on Oct. 15, 2019, provisional application No. 62/753,383, filed on Oct. 31, 2018.

(56) References Cited

U.S. PATENT DOCUMENTS

| | | | | |
|---|---|---|---|---|
| 7,746,649 B2* | 6/2010 | Miller | ............... | H05K 7/14324 |
| | | | | 361/622 |
| 8,289,113 B2* | 10/2012 | Miller | ............... | H05K 7/14324 |
| | | | | 361/679.01 |
| 9,142,364 B2* | 9/2015 | Pal | ......................... | H01H 1/62 |
| 9,185,791 B2* | 11/2015 | Wang | ................. | H05K 1/0204 |
| 11,858,437 B2* | 1/2024 | Anglin | ................... | H01H 50/12 |
| 2008/0030208 A1* | 2/2008 | Aratani | ............... | H01M 10/425 |
| | | | | 324/713 |
| 2013/0242312 A1* | 9/2013 | Olszak | ............... | G01B 9/02057 |
| | | | | 356/497 |
| 2018/0132343 A1* | 5/2018 | Pal | ..................... | H05K 1/0203 |
| 2019/0296657 A1* | 9/2019 | Chung | ................ | H02M 7/003 |

* cited by examiner

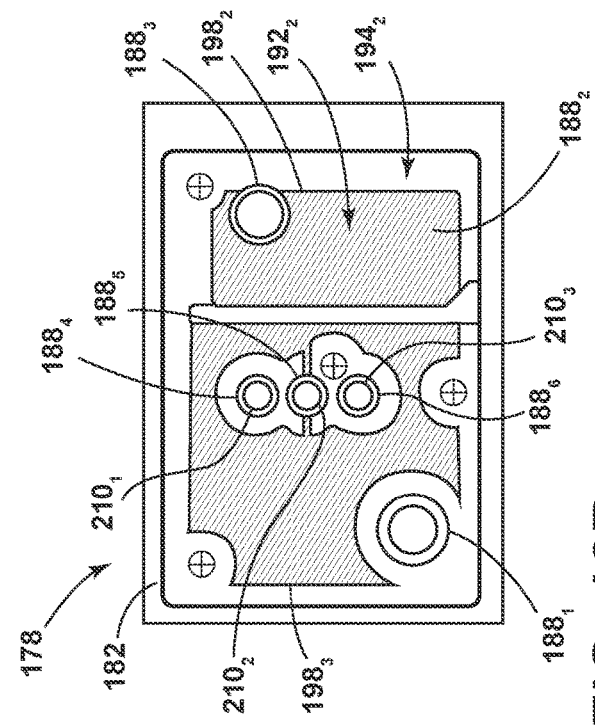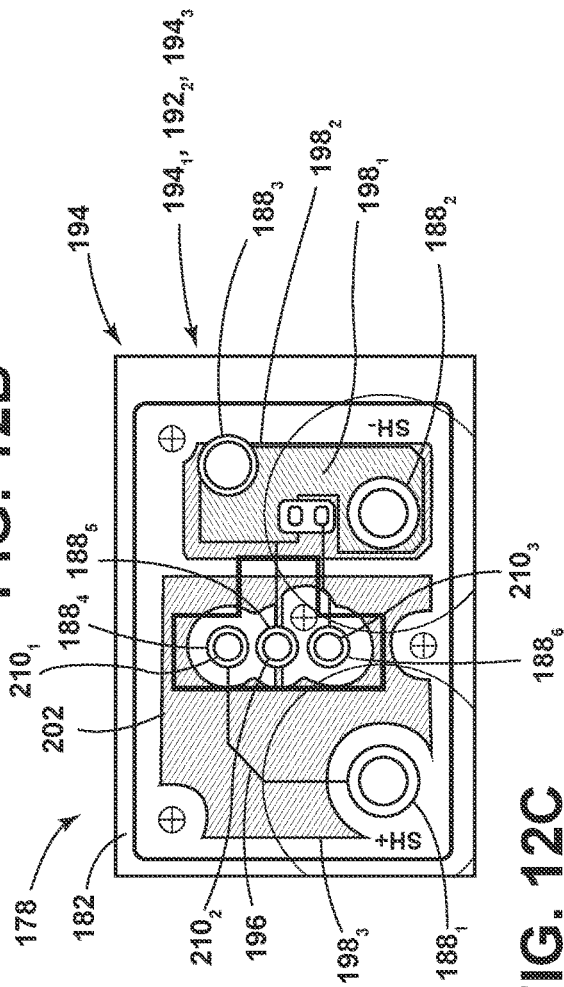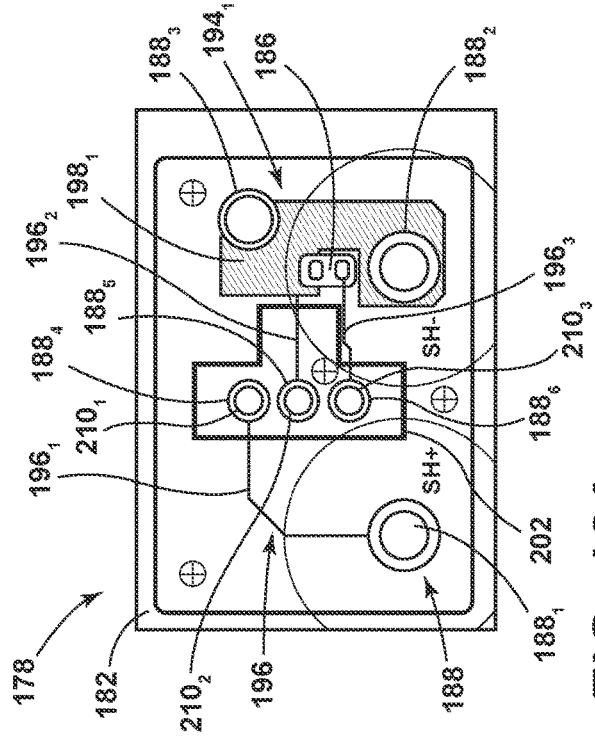

ELECTRICAL ASSEMBLY

CROSS-REFERENCE TO RELATED APPLICATION

This application is a continuation of U.S. patent application Ser. No. 17/495,131, filed Oct. 6, 2021, which is a continuation-part-application of U.S. patent application Ser. No. 17/395,082, filed Aug. 5, 2021, now U.S. Pat. No. 11,558,963, which is (i) a continuation-part-application of U.S. patent application Ser. No. 17/223,738, filed Apr. 6, 2021, now U.S. Pat. No. 11,721,956, which is (ii) a continuation-in-part application of U.S. patent application Ser. No. 16/592,126, filed Oct. 3, 2019, now U.S. Pat. No. 10,971,873, which claims the benefit of U.S. Provisional Patent Application Ser. No. 62/753,383, filed on Oct. 31, 2018, and (iii) a continuation-in-part application of U.S. patent application Ser. No. 17/071,588, filed Oct. 15, 2020, now U.S. Pat. No. 11,547,024, which claims the benefit of U.S. Provisional Patent Application Ser. No. 62/915,568, filed on Oct. 15, 2019.

The disclosures of all of the foregoing are hereby incorporated by reference in their entireties as though fully set forth herein.

TECHNICAL FIELD

The present disclosure generally relates to electrical assemblies, including assemblies that may include electrical contactors, circuit boards, and/or current sensors that may, for example, be used in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical assemblies do not provide sufficient functionality, are not configured for use with large electrical currents, do not provide sufficient cooling (e.g., that may be associated with large electrical currents), and/or require complicated assembly processes.

There is a desire for solutions/options that minimize or eliminate one or more challenges or shortcomings of electrical assemblies. The foregoing discussion is intended only to illustrate examples of the present field and is not a disavowal of scope.

SUMMARY

In embodiments, an electrical assembly may include a bus bar assembly, a sensor assembly, including a circuit board connected to the bus bar assembly, and a sensor, a bracket connected to the bus bar assembly, and a cooling member connected to the bracket.

With embodiments, a method of assembling an electrical assembly may include connecting a shunt resistor with a bus bar assembly, connecting a circuit board with the bus bar assembly, connecting the bus bar assembly with the bracket, disposing the cooling member on or about the bracket, and/or connecting the cooling member with the bracket.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

FIG. 12A-12C are top views generally illustrating an embodiment of a circuit board assembly of a sensor of an electrical assembly.

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
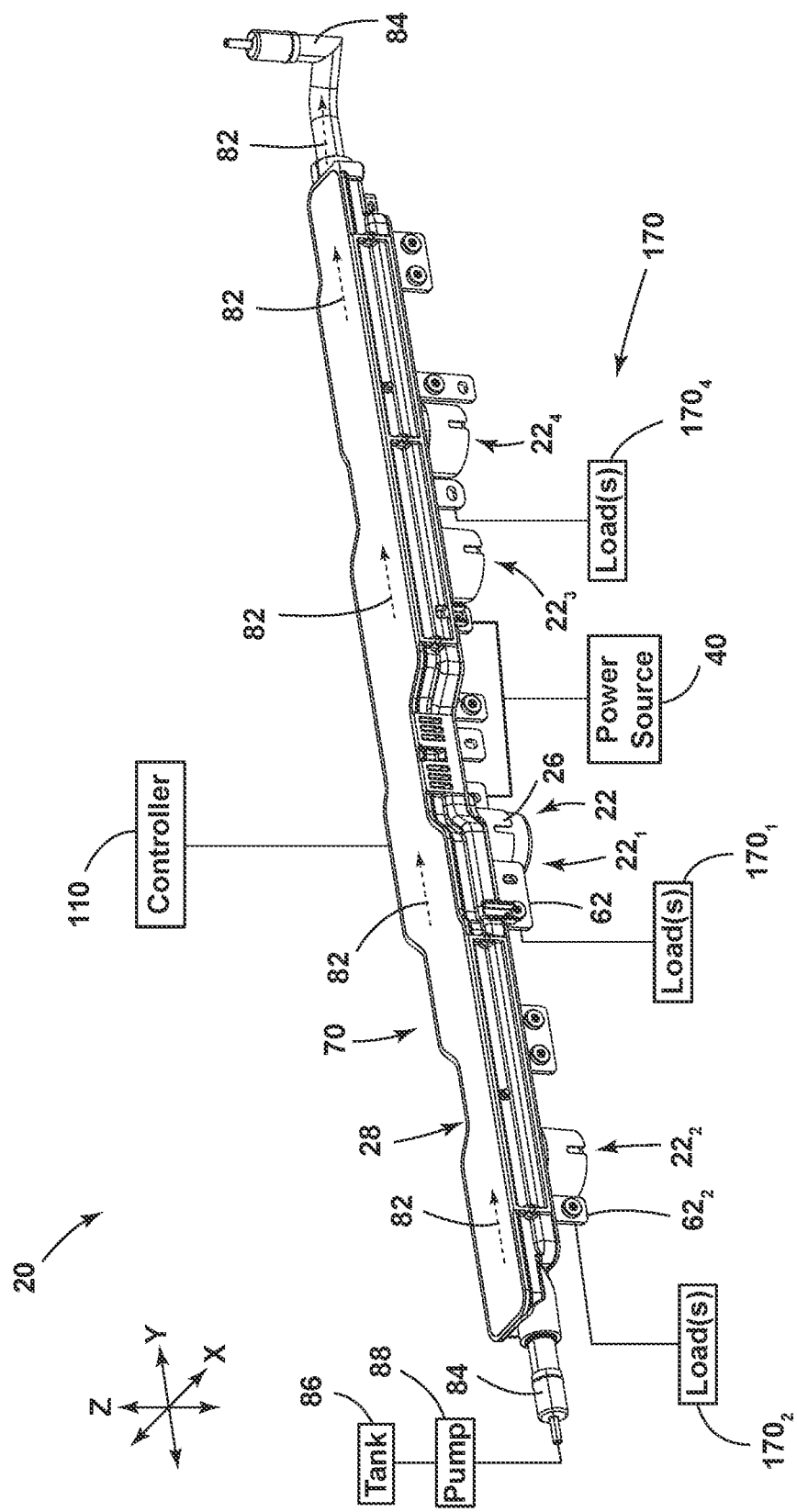
FIG. 1 is a perspective view generally illustrating an embodiment of an electrical assembly.
Figure 2:
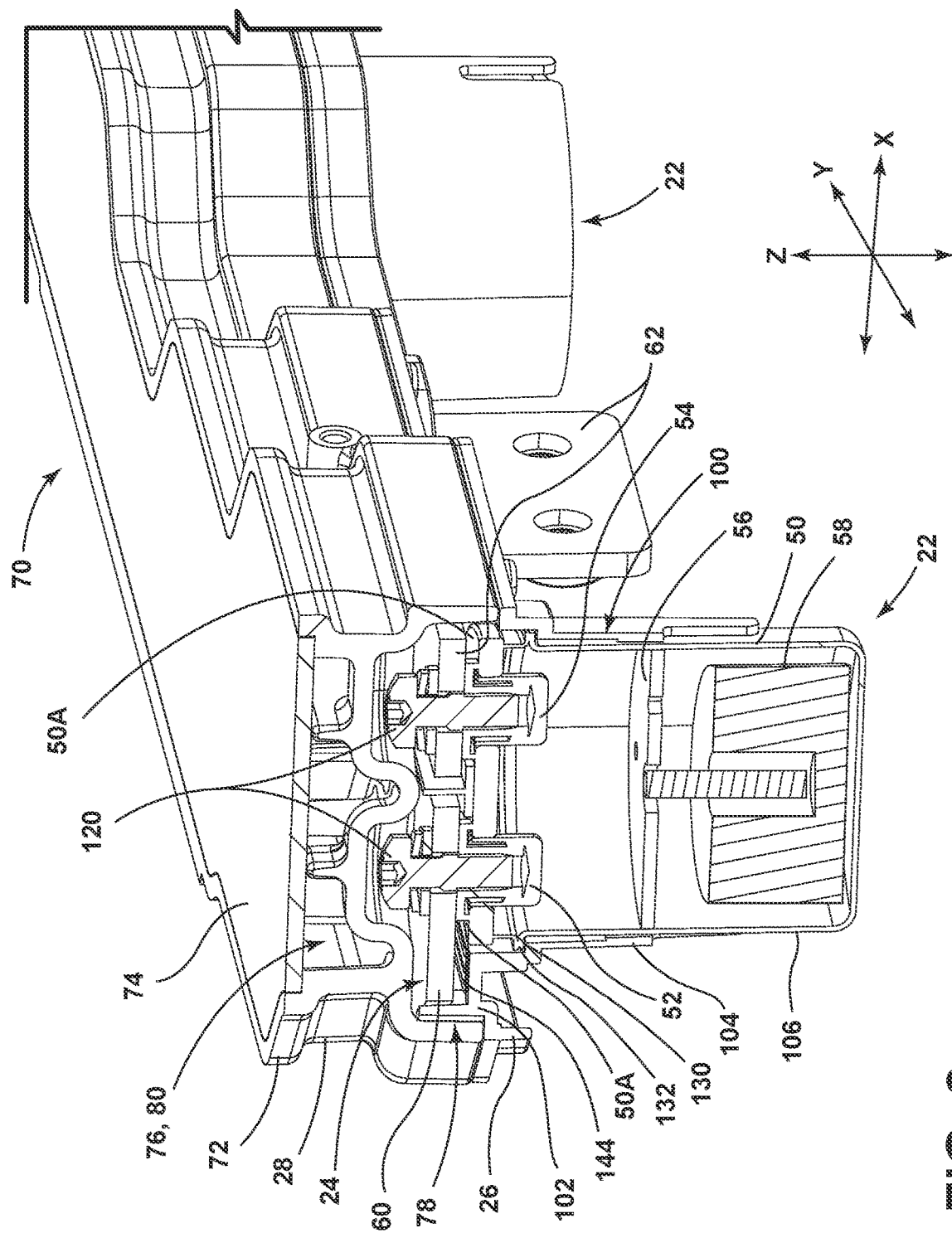
FIG. 2 is a cross-sectional perspective view generally illustrating a portion of an embodiment of an electrical assembly.

In embodiments, such as generally illustrated in FIGS. 1 and 2, an electrical assembly 20 may include one or more contactors 22 (or relays, electrical switches, etc.), such as a first contactor $22_1$, a second contactor $22_2$, a third contactor $22_3$, and/or a fourth contactor $22_4$, a bus bar assembly 24, a bracket 26, and/or a cooling member 28. Electrical currents flowing through the bus bar assembly 24 and/or the contactor(s) 22 may generate or result in a large amount of heat. For example and without limitation, an electrical assembly 20 and/or the contactors 22 may be configured for use with currents of at least 500 Amps (e.g., for several minutes or more), at least 1000 Amps, and/or at least 2500 Amps (e.g., for at least 10-15 seconds). The cooling member 28 may be configured to facilitate dissipation of at least some of the generated heat.

In embodiments, such as generally illustrated in FIG. 2, a contactor 22 may include an outer wall 50, a first contactor terminal 52, a second contactor terminal 54, an electrically conductive contact member 56 configured to selectively electrically connect the first terminal 52 and the second terminal 54, and/or actuator 58. An actuator 58 may be configured to change the contactor 22 from an inactive/open state in which the contact member 56 does not electrically connect the first terminal 52 and the second terminal 54, and an active/closed state in which the contact member 56 does electrically connect the first terminal 52 and the second terminal 54. An actuator 58 may, for example and without limitation, include an electromagnet, a coil, and/or a solenoid configured to move the contact member 56 into and out of electrical contact with the terminals 52, 54.

With examples, such as generally illustrated in FIG. 1, a bus bar assembly 24 may be electrically connected to one or contactors 22, a power source 40 (e.g., a battery, an outlet, etc.), and/or one or more electrical loads 170. A bus bar assembly 24 may include a first bus bar 60 and/or one or more second bus bars 62 (e.g., second bus bar $62_1$, $62_2$, $62_3$, $62_4$) (see, e.g., FIG. 3). The first bus bar 60 may be electrically connected to some or all of the contactors 22 and/or the power source 40. For example, the first bus bar 60 may be connected (e.g., directly) to the first terminals 52 of the contactor(s) 22 and may be connected to the power source 40, at least indirectly, to provide current from the power source 40 to the contactor(s) 22. In some configurations, the first bus bar 60 may include a first portion 60A that may be connected to the first terminals 52 of the first and second contactors $22_{1,2}$ and/or may include a second portion 60B that may be connected to the first terminals 52 of the third and fourth contactors $22_{3,4}$. The first portion 60A and the second portion 60B may be separate or integrally formed. A respective second bus bar 62 may be connected to a second terminal 54 of one or more contactors 22. The second bus bars 62 may electrically connect a contactor 22 to a respective load 170 (e.g., loads $170_1$, $170_2$, $170_3$, $170_4$). A load 170 may, for example and without limitation, include a single load or a plurality of loads, such as one or more vehicle systems or components (e.g., air conditioner, heater, electric motor, etc.).

Figure 3:
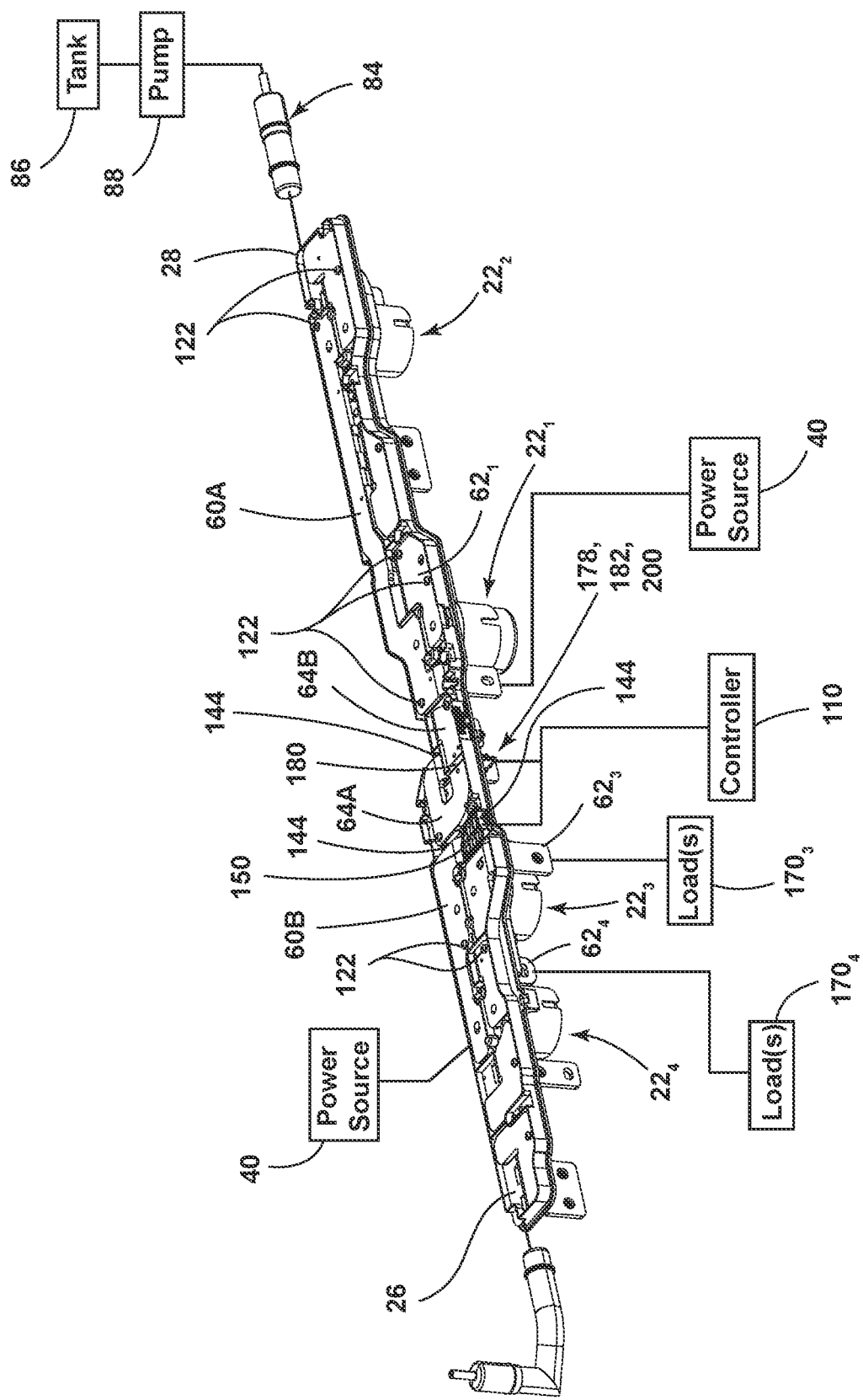
FIG. 3 is a cross-sectional perspective view generally illustrating an embodiment of an electrical assembly.
Figure 4:
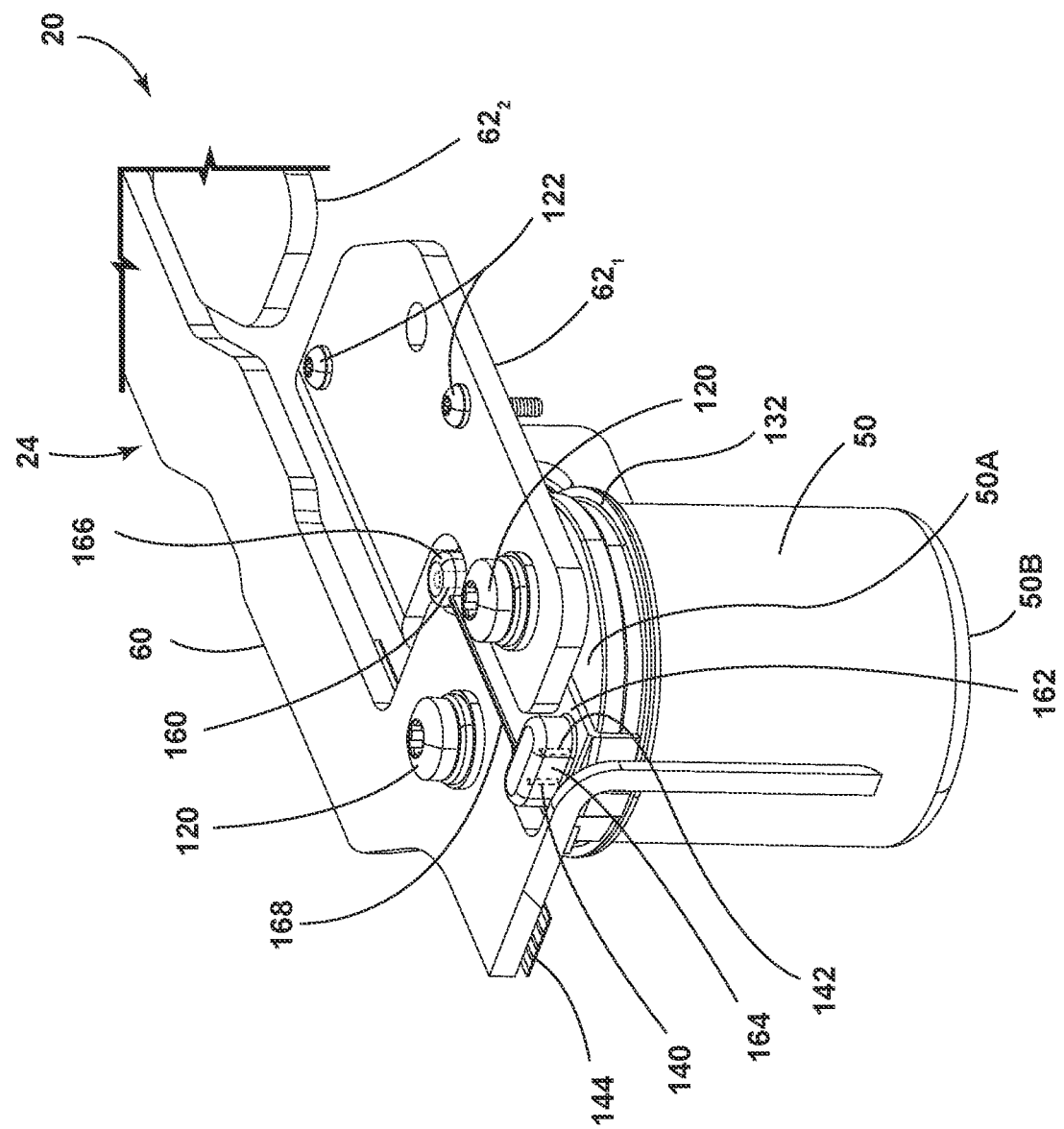
FIG. 4 is a partial cross-sectional perspective view generally illustrating a portion of an embodiment of an electrical assembly in which a bracket and a cooling member are hidden.

In embodiments, such as generally illustrated in FIGS. 2-4, a bus bar assembly 24 may, for example, be disposed, at least in part, directly on one or more contactors 22. For example and without limitation, the first bus bar 60 may be disposed directly on the outer wall 50 and/or the first terminal 52 of a contactor 22. A second bus bar 62 may be disposed directly on an outer wall 50 and/or a second terminal 54 of a contactor 22.

In examples, such as generally illustrated in FIGS. 1 and 2, a cooling member 28 may be configured for active cooling (e.g., as an active cooling member). The cooling member 28 may include a body 70 (e.g., a cold plate) having a first portion/member 72 and a second portion/member 74. The first portion 72 and the second portion 74 may be separate/independent (e.g., separate monolithic components) and may be configured to be connected together. The first portion 72 may be configured as a body and the second portion 74 may be configured as a cover. For example and without limitation, the first portion 72 may include a first recess 76 disposed in a first (e.g., top) surface and the second portion 74 may be configured to cover the first recess 76 such that the first recess 76 and the second portion 74 may function as and/or provide a fluid passage 80 (see, e.g., FIG. 2). The first recess 76 may, for example, extend along substantially all of the length of the cooling member 28. The fluid passage 80 may be configured to receive a cooling fluid 82 (e.g., water, glycol, air, etc.) and/or a fluid conduit 84 (e.g., a pipe, tube, etc.) for the cooling fluid 82. The fluid passage 80 and/or the fluid conduit 84 may be connected to a fluid reservoir/tank 86 of cooling fluid 82 and/or a pump 88 that may pump the cooling fluid 82, such as from the fluid reservoir 86, through the cold plate 70 to dissipate heat from the electrical assembly 20 (see, e.g., FIG. 1).

Figure 6:
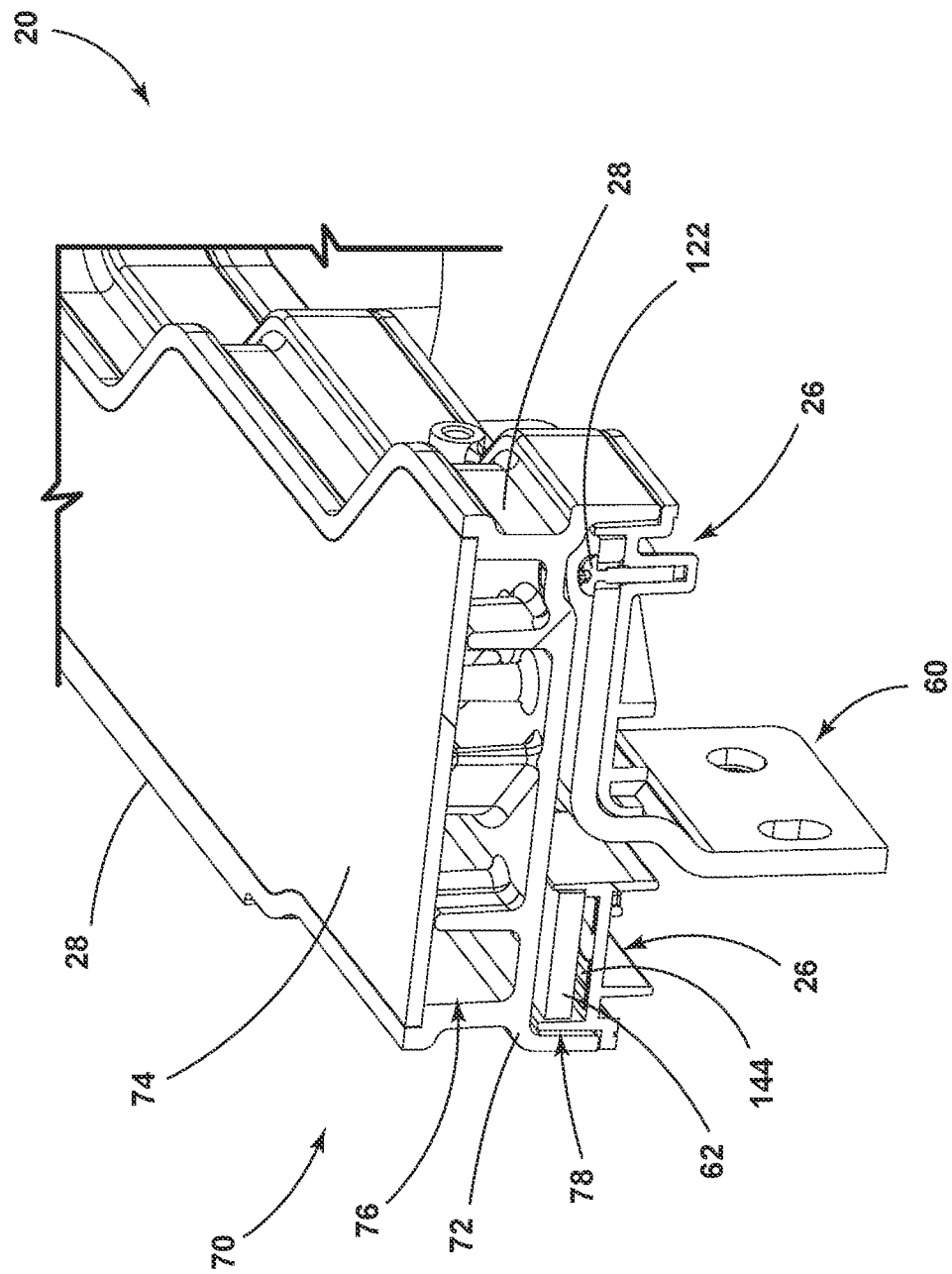
FIG. 6 is a partial cross-sectional perspective view generally illustrating a portion of an embodiment of an electrical assembly.
Figure 7:
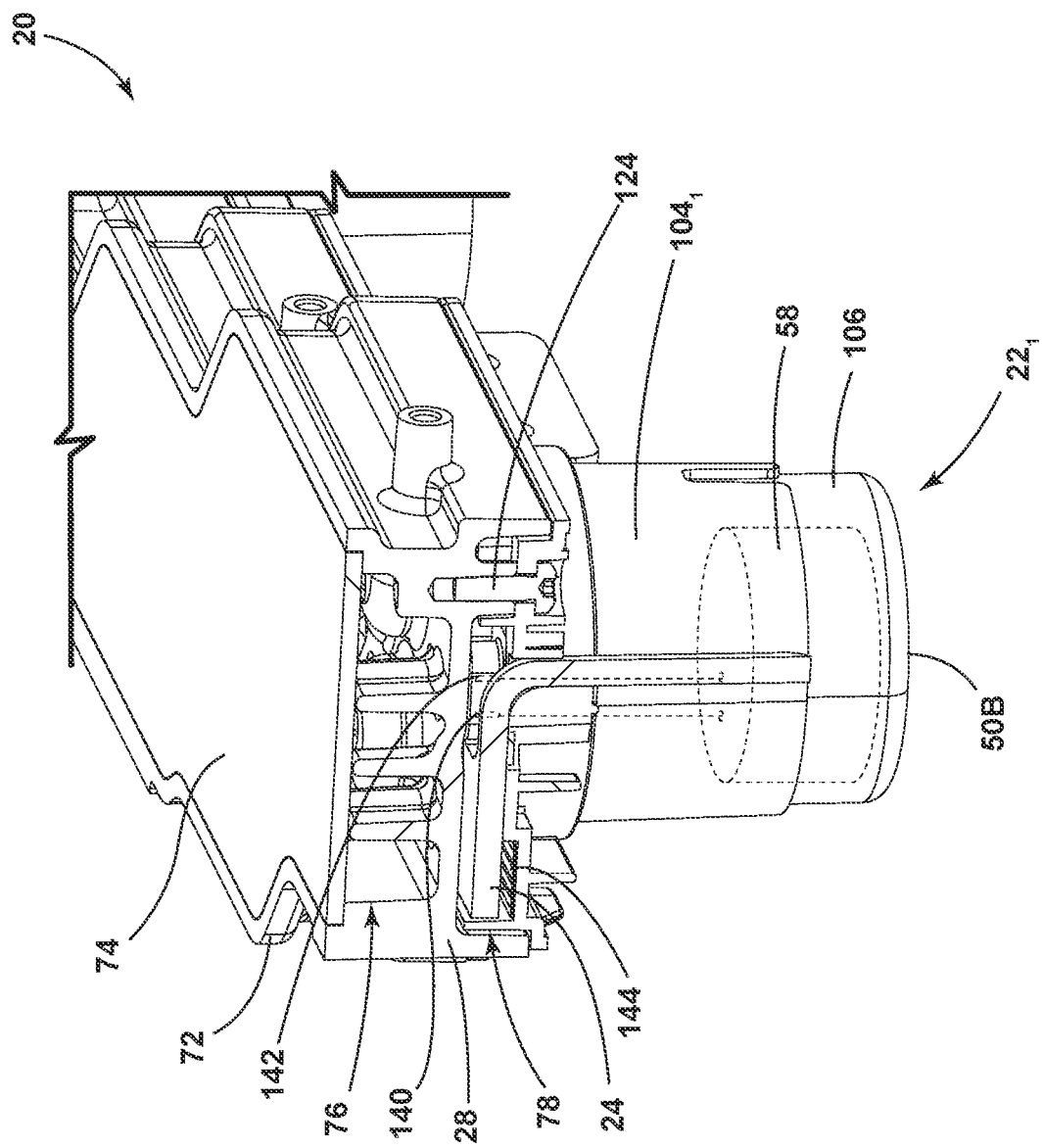
FIG. 7 is a cross-sectional perspective view generally illustrating a portion of an embodiment of an electrical assembly.

In embodiments, such as generally illustrated in FIGS. 2, 6, and 7, a cooling member 28 may include a second recess 78 that may be disposed opposite the first recess 76 (e.g., the first recess 76 and the second recess 78 may open in opposite directions). The second recess 78 may be configured to at least partially receive one or more contactors 22, a bus bar assembly 24, a bracket 26, and/or a flexible circuit 144. The second recess 78 may, for example, extend along substantially all of the length of the cooling member 28. The first recess 76 and/or the second recess 78 of the cooling member 28 may provide the cooling member 28 and/or the body 70 with an at least partially hollow configuration and/or a generally H-shaped cross-sectional shape.

Figure 5:
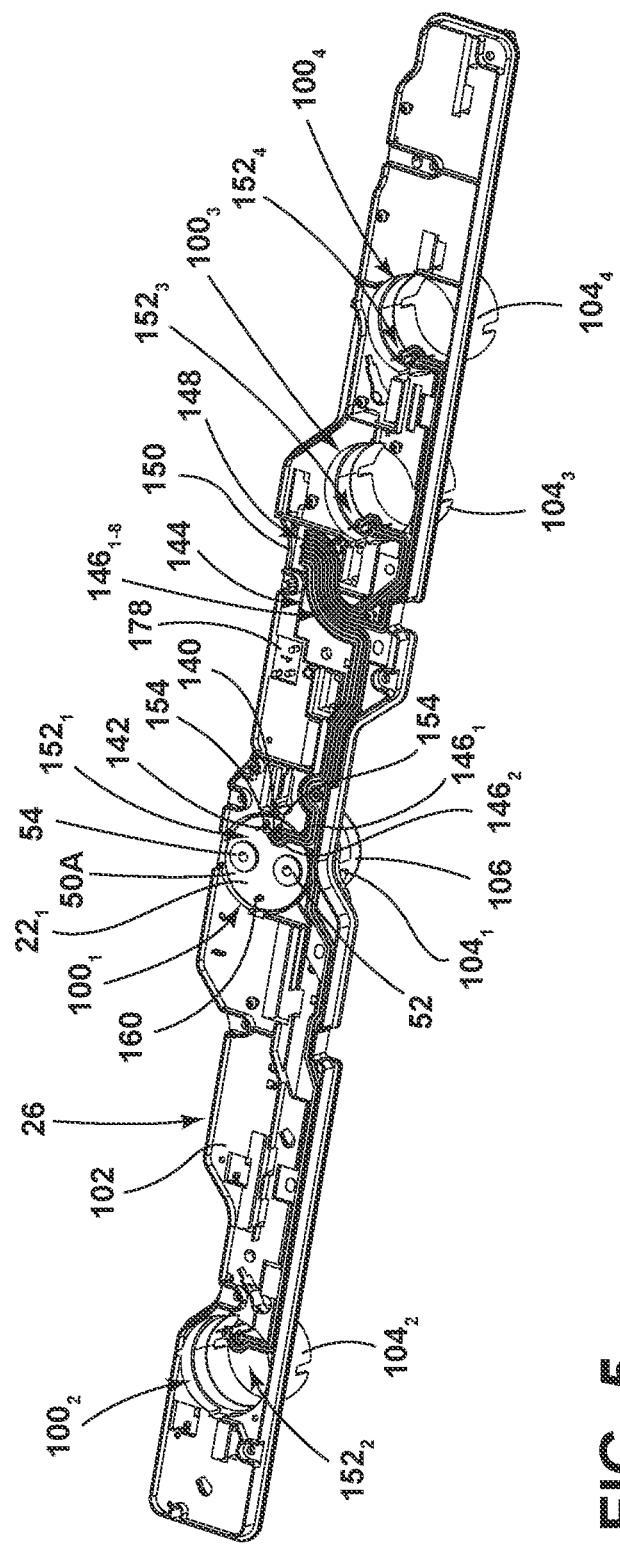
FIG. 5 is a perspective view generally illustrating portions of embodiments of a bracket, a contactor, and a flexible circuit of an embodiment of an electrical assembly.

With embodiments, such as generally illustrated in FIGS. 1 and 5, a bracket 26 may be configured to connect a cooling member 28 with one or more contactors 22, such as via a bus bar assembly 24. A bracket 26 may include one or more of a variety of shapes, sizes, materials, and/or configurations. For example and without limitation, the bracket 26 may include plastic and/or one or more electrically insulating materials, and may include a generally elongated rectangular frame configuration. A bracket 26 may include one or more apertures 100 that may be configured to at least partially receive a contactor 22 (see, e.g., FIG. 5). For example and without limitation, a bracket 26 may include apertures $100_{1-4}$ for contactors $22_{1-4}$. An aperture 100 may be configured as a through aperture that may extend through the bracket 26. The bracket 26 may include one or more sleeve portions 104 (e.g., sleeve portions $104_{1-4}$) that may extend from a body 102 of the bracket 26 and that may at least partially define the one or more apertures 100. A sleeve portion 104 may be configured to limit movement (e.g., tilting, X-movement, Y-movement, etc.) of a contactor 22. A shape of at least some of a sleeve portion 104 may, for example, generally correspond to a shape at least some of a contactor 22. For example and without limitation, a sleeve portion 104 may include a generally cylindrical configuration if a contactor 22 includes a generally cylindrical configuration, and/or a sleeve portion 104 may include a generally rectangular configuration if a contactor 22 includes a generally rectangular configuration. Some sleeve portions 104 may be shorter (e.g., in an axial/Z-direction) than a contactor 22 such that the sleeve portion 104 covers some of the outer wall 50 of a contactor 22 and an exposed portion 106 of the outer wall 50 is not covered by the sleeve portion 104 (see, e.g., contactor 22₁). The exposed portion 106 may, for example, include a side (e.g., an outer radial surface) of the outer wall 50, be disposed proximate a second (e.g., bottom) end of the contactor 22, include a second/bottom surface 50B of the contactor 22, and/or extend around some or all of a perimeter/circumference of the contactor 22.

In embodiments, other sleeve portions 104 may be about the same length as or longer than a contactor 22 such that the sleeve portion 104 and the body 102 may substantially cover a side surface (e.g., an outer radial surface) of the outer wall 50 (see, e.g., contactors 22₂₋₄). The body 102 and the sleeve portions 104 may not cover first surfaces 50A (e.g., top axial surfaces) of the contactors 22 and/or may not cover second surfaces 50B (e.g., bottom axial surfaces) of the contactors 22, which may facilitate cooling. For example and without limitation, the outer wall 50, the second surfaces 50B, and/or the exposed portion 106 of a contactor 22 may comprise metal (e.g., steel) and ambient air may flow past the second surfaces 50B and/or the exposed portion 106, which may provide cooling/heat dissipation, at least to some degree. In contrast, some other contactor designs include a plastic housing (e.g., a thermally insulating housing) that covers all of a contactor, limiting cooling/heat dissipation.

With embodiments, such as generally illustrated in FIGS. 2, 4, 6, and 7, one or more contactors 22, a bus bar assembly 24, a bracket 26, and/or a cooling member 28 may be connected together (e.g., mechanically). The one or more contactors 22 may be connected to the bus bar assembly 24. For example and without limitation, the one or more contactors 22 may be fixed (e.g., bolted/screwed) to a first bus bar 60 and a second bar 62 via one or more first fasteners 120 (see, e.g., FIGS. 2 and 4). Connection between the bus bar assembly 24 (e.g., bus bars 60, 62) and the contactor(s) 22 may provide and/or facilitate an electrical connection between the bus bars 60, 62 and the contactors 22. In embodiments, such as generally illustrated in FIG. 6, the bus bar assembly 24 may be connected to the bracket 26. For example and without limitation, the bus bars 60, 62 may be fixed (e.g., bolted/screwed) to the bracket 26 via one or more second fasteners 122 that may be inserted into the bus bars 60, 62 and then down into a top of the bracket 26. With embodiments, such as generally illustrated in FIG. 7, the bracket 26 may be connected to the cooling member 28. For example and without limitation, the bracket 26 may be fixed (e.g., bolted/screwed) to the cooling member 28 via one or more third fasteners 124 that may be inserted into the bracket 26 and then up into a bottom of the cooling member 28. A fastener 120, 122, 124 may, for example and without limitation, include a screw, a bolt, and/or a rivet, among others.

In some embodiments, the one or more contactors 22 may, for example, be directly fixed to the bus bar assembly 24, may be indirectly fixed to the bracket 26 via the bus bar assembly 24, and/or may be indirectly fixed to the cooling member 28 via the bus bar assembly 24 and the bracket 26. The one or more contactors 22 may, for example and without limitation, not be fixed directly to the bracket 26 and/or the cooling member 28. The bus bar assembly 24 may be directly fixed to the bracket 26 and/or may be indirectly fixed to the cooling member 28 via the bracket 26. The bus bar assembly 24 may, for example and without limitation, not be fixed directly to the cooling member 28.

With embodiments, such as generally illustrated in FIG. 2, an aperture 100 of a bracket 26 may include a lip 130 (e.g., axial surface) that may be configured to contact a contactor 22. For example, an outer wall 50 of a contactor 22 may include a flange 132 that may extend outward (e.g., radially outward), and the contactor 22 may be inserted into the aperture 100 until the flange 132 contacts the lip 130. The lip 130 may at least temporarily support the contactor 22, such as until the contactor 22 is connected with the bus bar assembly 24.

In embodiments, a controller 110 may be configured to control the contactors 22 to selectively to provide power from a power source 40 to one or more electrical loads 170 (see, e.g., FIGS. 1 and 3). For example and without limitation, the controller 110 may be configured to generate one or more control signals to control operation of an actuator 58 of a contactor 22 to selectively open and close the contactor 22, which may selectively provide power from the power source 40 to the one or more electrical loads 170.

Figure 8:
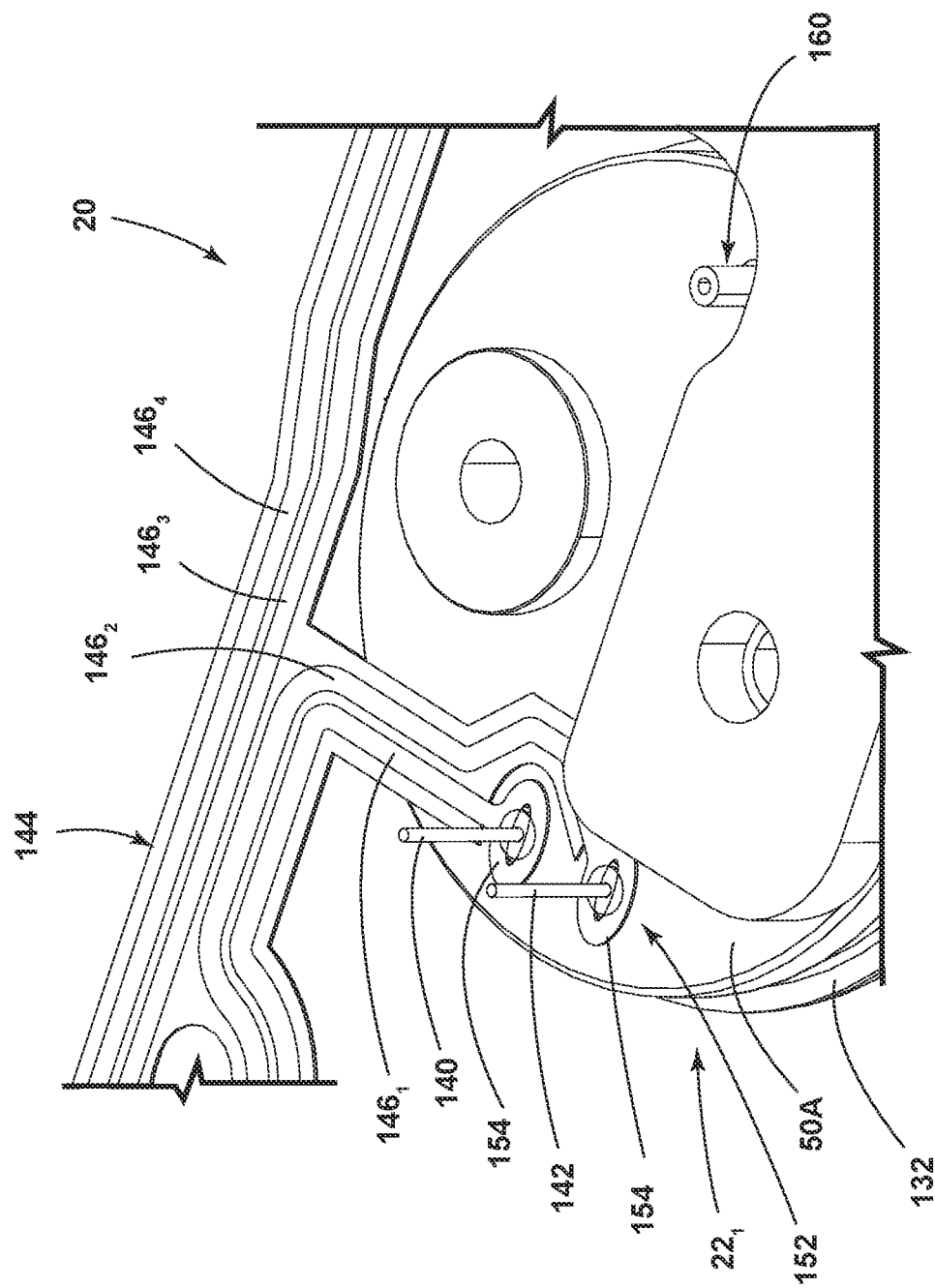
FIG. 8 is a partial perspective view generally illustrating a portion of an embodiment of an electrical assembly in which a bracket, a bus bar assembly, and a cooling member are hidden.

In some example configurations, the controller 110 may be electrically connected to a first control terminal 140 and/or a second control terminal 142 of a contactor 22 that may be connected (e.g., electrically) to an actuator 58 of the contactor 22 (see, e.g., FIG. 8). For example and without limitation, the controller 110 may be connected to the control terminals 140, 142 via a flexible circuit/ribbon cable 144 that may include a conductor 146 (e.g., conductors 146₁₋₈) for each control terminal 140, 142. The flexible circuit 144 may include a first end 148 that may be connected to an electrical connector 150 that may be connected to the bracket 26 (see, e.g., FIG. 5). The controller 110 may be electrically connected to the flexible circuit 144 via the electrical connector 150. The electrical connector 150 may include a terminal/pin for each conductor 146 of the flexible circuit 144. For example and without limitation, a single electrical connector 150 (e.g., an external electrical connector) may provide/facilitate electrical connections with a plurality of contactors 22.

With embodiments, a flexible circuit 144 may include one or more second ends 152 (e.g., second ends 152₁, 152₂, 152₃, 152₄) that may be connected to respective contactors 22 (see, e.g., FIGS. 5 and 8). A second end 152 may include a pair of conductors 146 connected to the control terminals 140, 142. The pair of conductors 146 may, for example, include eyelets 154 that may be disposed over/around the control terminals 140, 142 (e.g., the control terminals 140, 142 may be inserted into the eyelets 154). The eyelets 154 may be integrally formed as part of the flexible circuit 144.

In embodiments, such as generally illustrated in FIGS. 3, 6, and 7, a flexible circuit 144 may be disposed on and/or extend along a top surface of a bracket 26, such as to some or each of the one or more contactors 22. The flexible circuit 144 may, for example, be disposed at least partially below a bus bar assembly 24. For example and without limitation, most or substantially all of the flexible circuit 144 may be disposed between one or more bus bars 60, 62 and the bracket 26. The bus bars 60, 62 may be disposed at a relatively small distance from the bracket 26 that may be sufficient for the flexible circuit 144, but there may be insufficient space for individual wires or other types of cables/wires.

With embodiments, such as generally illustrated in FIG. 8, a contactor 22 may include a vent 160 (e.g., a fluid vent). The vent 160 may be configured to limit fluid pressure differentials between the inside and the outside of a contactor 22. For example and without limitation, if the temperature inside a contactor 22 increases, the air pressure inside the contactor may increase. The vent 160 may allow air to flow out of the contactor 22 to decrease the internal air pressure, such as if the pressure exceeds a pressure threshold. Additionally or alternatively, the vent 160 may allow air to flow into the contactor 22 to increase the internal air pressure, such as if the pressure is below a second pressure threshold.

With embodiments, such as generally illustrated in FIG. 4, a contactor 22 may include a top cover 162. The top cover 162 may at least partially cover a first control terminal 140, a second control terminal 142, and/or a vent 160. For example and without limitation, a top cover 162 may include a first recess 164 that may at least partially cover and/or receive a first control terminal 140 and/or a second control terminal 142. Additionally or alternatively, a top cover 162 may include a second recess 166 that may at least partially cover and/or receive a vent 160. The top cover 162 may include an insulating wall 168 that may extend at least partially between a first terminal 52 and a second terminal 54 and/or between the first recess 164 and the second recess 166. For example and without limitation, a top cover 162 may be substantially planar and may extend from the first recess 164 to the second recess 166 such that the top cover 162 separates and electrically insulates the first terminal 52 and the second terminal 54. The top cover 162 may include an electrically insulating material that may or may not be thermally conductive.

In embodiments, the electrical loads 170 may include one or more complementary loads, which may include loads being configured such that only one (e.g., of a pair or set) would be expected to be activated/operated at any given time. For example and without limitation, a first electrical load $170_1$ may include an air conditioner (e.g., to provide cooled air, such as in a vehicle) and/or a second electrical load $170_2$ may include a heater (e.g., to provide warmed air, such as in the vehicle).

Figure 9:
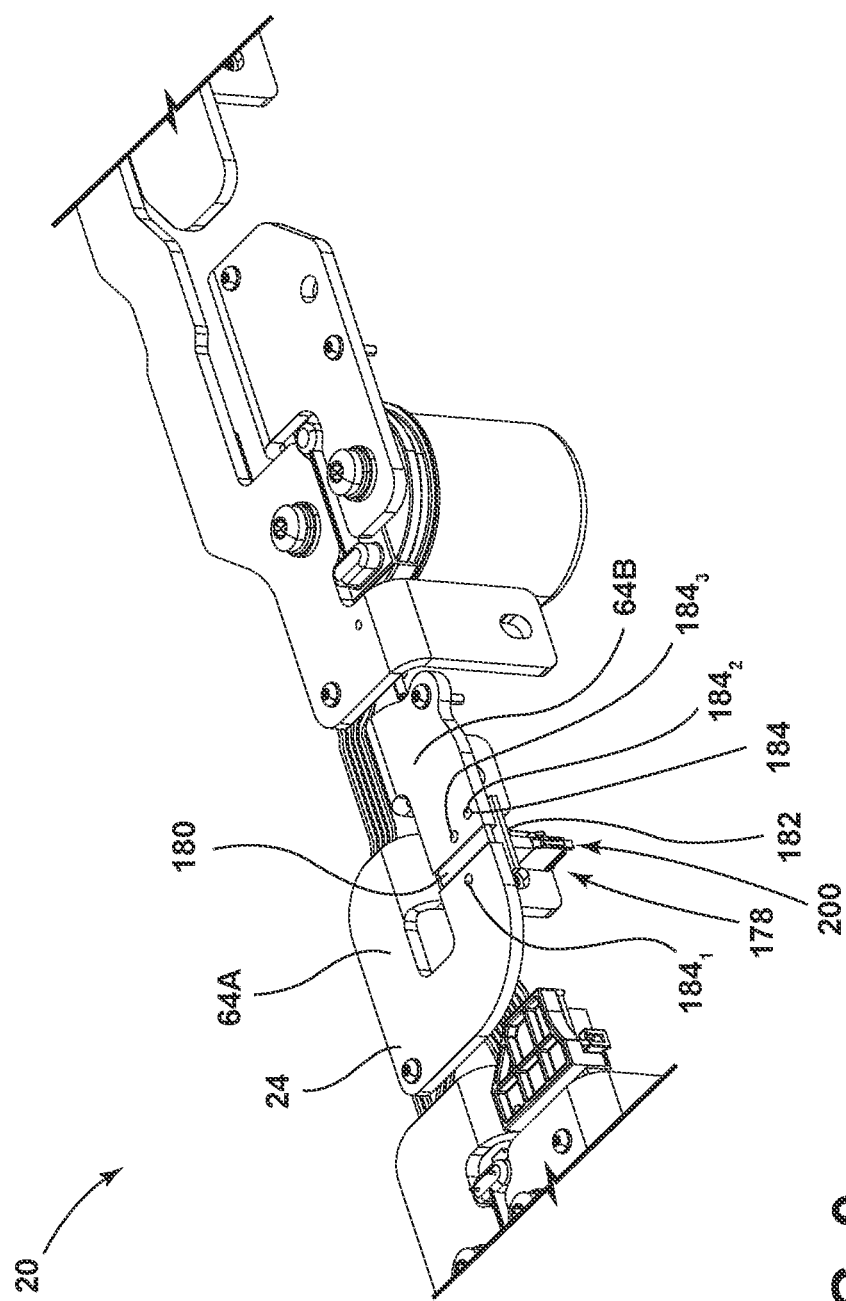
FIG. 9 is a partial perspective view generally illustrating an embodiment of an electrical assembly.

With embodiments, such as generally illustrated in FIG. 9, an electrical assembly 20 may include a sensor assembly 178. The sensor assembly 178 may include a shunt resistor 180, a circuit board 182, and/or a plurality of pins 184, such as a first pin $184_1$, a second pin $184_2$, and/or a third pin $184_3$. In some configurations, the shunt resistor 180 may be connected (e.g., directly) to the bus bar assembly 24. For example, the shunt resistor 180 may be connected to the bus bar assembly 24 via welding, riveting, soldering, using fasteners such as screws, bolts, and nuts, and/or adhesive, among others. In some examples, the shunt resistor 180 may be disposed between and/or connected to a bus bar first portion 64A and a bus bar second portion 64B of the bus bar assembly 24. The bus bar first and second portions 64A, 64B may be portions of a first bus bar 60, a second bus bar 62, or another bus bar.

In embodiments, the shunt resistor 180 may be configured to facilitate determining an electrical current flowing through a bus bar of the bus bar assembly 24. For example, the shunt resistor 180 may connect the bus bar first portion 64A with the bus bar second portion 64B, such that an electrical current is able to flow through the bus bar first portion 64A, the shunt resistor 180, and the bus bar second portion 64B. The electrical current may be determined by measuring a voltage drop across the shunt resistor 180 (e.g., measuring the voltage drop between the bus bar first portion 64A and the bus bar second portion 64B).

With embodiments, such as generally illustrated in FIGS. 11 and 12A-12C, a circuit board 182 may include a sensor 186 that may be configured to, at least in part, obtain temperature information about the bus bar assembly 24. In some example configurations, the circuit board 182 may include one or more apertures 188, such as a first aperture $188_1$, a second aperture $188_2$, a third aperture $188_3$, a fourth aperture $188_4$, a fifth aperture $188_5$, and/or a sixth aperture $188_6$ (see, e.g., FIGS. 12A-12C). One or more of the apertures $188_{1-6}$ may, for example and without limitation, include plated through holes.

In some embodiments, the sensor 186 may include a thermistor. For example and without limitation, the sensor 186 may include a negative temperature coefficient (NTC) thermistor. With such a configuration, when a temperature that the sensor 186 is exposed to increases, a resistance of the sensor 186 may decrease. Conversely, when the temperature that the sensor 186 is exposed to decreases, a resistance of the sensor 186 may increase.

With embodiments, the circuit board 182 may be fixed directly to the bus bar assembly 24. For example, the circuit board 182 may be connected to bus bar assembly 24 via a plurality of pins 184. In some instances, the plurality of pins 184 may include an electrically conductive and thermally conductive material (e.g., a metal). A first pin $184_1$ of the plurality of pins 184 may be fixed directly (e.g., press-fit, welded, riveted, soldered, glued, among others) to a first bus bar 60, and/or a second pin $184_2$ of the plurality of pins 184 may be fixed directly to a second bus bar 62.

In some examples, the circuit board 182 may be offset from bus bar assembly 24 via the plurality of pins 184. For example, the first pin $184_1$ and the second pin $184_2$ may each include a first portion $190A_{1-3}$ having a first diameter $D_1$ and/or a second portion $190B_{1-3}$ having a second diameter $D_2$ that is larger than the first diameter $D_1$. The second portion $190B_1$ of the first pin $184_1$ may be connected to and extend away from a first surface $S_A$ of the bus bar first portion 64A, and the second portion $190B_2$ of the second pin $184_2$ may be connected to and extend away from a first surface $S_B$ of the bus bar second portion 64B. The first portion $190A_1$ of the first pin $184_1$ may be disposed at least partially in a first aperture $188_1$ of the circuit board 182, and the first portion $190A_2$ of the second pin $184_2$ may be disposed at least partially in a second aperture $188_2$ of the circuit board 182. In an assembled configuration, the circuit board 182 may be supported by the second portions $190B_{1-2}$ of the first pin $184_1$ and the second pin $184_2$, and/or may be offset from the first surface $S_A$ the bus bar first portion 64A and the first surface $S_B$ of the bus bar second portion 64B by a distance $L_1$ (see, e.g., FIG. 15). For example and without limitation, the pins $184_{1-3}$ may include shoulder pins that may have respective shoulders $190C_{1-3}$ on which the circuit board 182 may be disposed.

Figure 15:
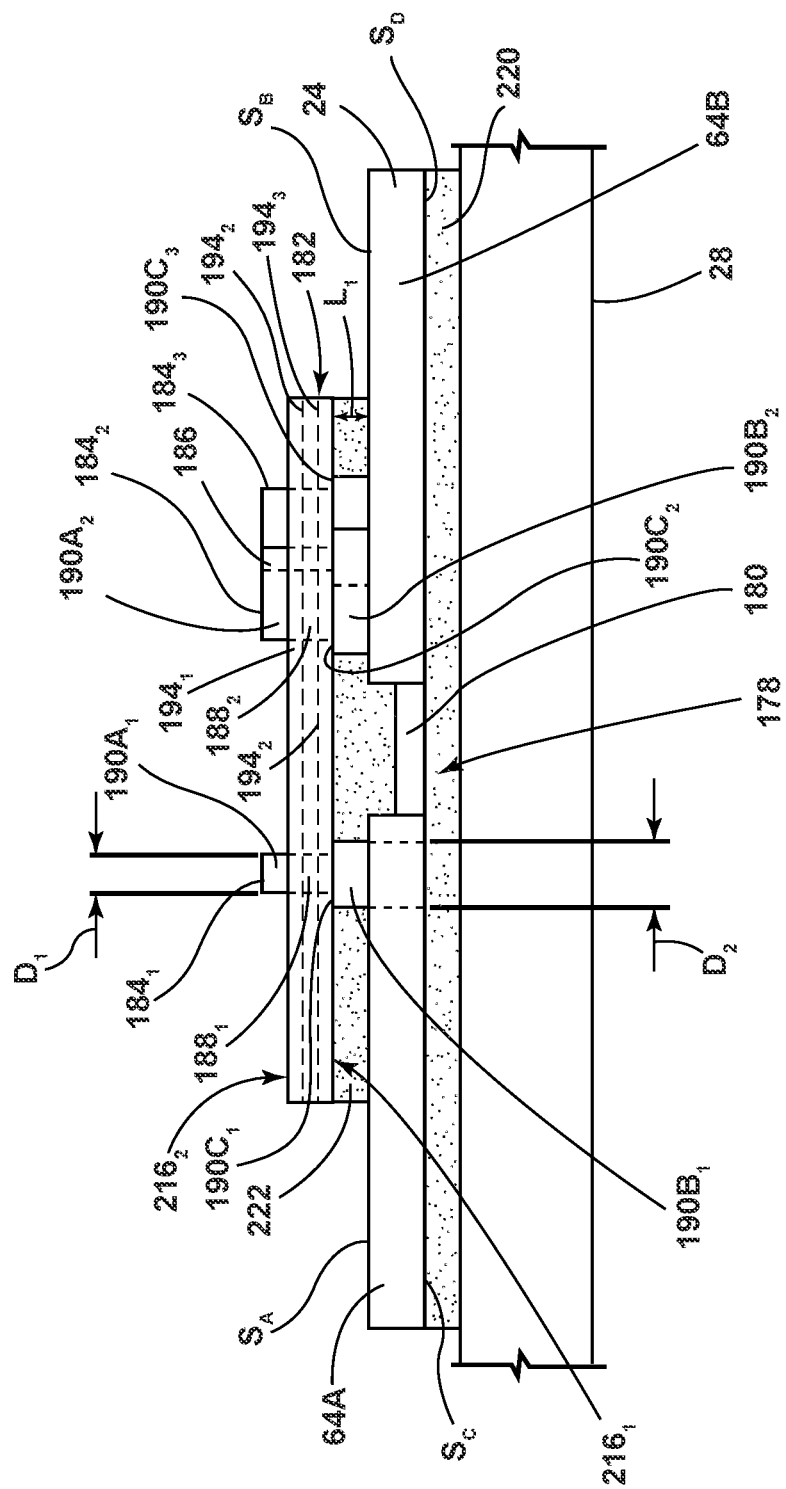
FIG. 15 is a side view generally illustrating portions of an embodiment of an electrical assembly.

With embodiments, such as generally illustrated in FIG. 15, first surfaces $S_{A-B}$ and/or the shunt resistor 180 may be thermally coupled to the circuit board 182, such as via a thermally conductive material 222 (e.g., potting material). The thermally conductive material 222 may, in some examples, fill a gap between (i) the circuit board and (ii) the first surfaces $S_{A-B}$ and/or the shunt resistor 180. Second surface $S_{C-D}$ of the bus bar portions 64A, 64B may be thermally coupled to the cooling member 28, such as via a thermally conductive material 220, which may or may not have the same material composition as thermally conductive material 222. For example and without limitation, the bus bar portions 64A, 64B and/or the shunt resistor 180 may be disposed at least partially directly between the cooling member 28 and the circuit board 182 (e.g., in an overlapping configuration).

In embodiments, such as generally illustrated in FIGS. 12A-12C, the circuit board 182 may include a plurality of layers 194, such as a first layer $194_1$, a second layer $194_2$, and/or one or more additional layers $194_3$. In some examples, the circuit board 182 may include a plurality of electrical traces 196, such as a first electrical trace $196_1$, a second electrical trace $196_2$, and/or a third electrical trace $196_3$ (see, e.g., FIG. 12A). The first layer $194_1$ may include a conductor portion $198_1$ (e.g., a copper pour) that may have a shape that may correspond and/or be substantially similar to a shape of the sensor 186 (see, e.g., FIG. 12A). For example and without limitation, the first conductor portion $198_1$ may include a generally U-shaped configuration and a gap between the legs may be at least partially aligned with the sensor 186 (e.g., in a direction perpendicular to the circuit board 182). The second layer $194_2$ may include one or more conductor portions $198_{2-3}$ that may be larger than the conductor portion $198_1$ of the first layer $194_1$ (see, e.g., FIG. 12B). In an assembled configuration, the conductor portion $198_1$ of the first layer $194_1$ and/or the conductor portion $198_2$ of the second layer $194_2$ may facilitate, at least in part, a thermal transfer from the bus bar assembly 24 to the sensor 186. In some embodiments, one or more layers $194_{1-3}$ and/or one or more conductor portions $198_{1-3}$ may be connected to and/or in contact with an aperture $188_{1-6}$ and/or conductive material/plating thereof. For example and without limitation, the first conductor portion $198_1$ and/or the second conductor portion $198_2$ may be in contact with plating of the third aperture $188_3$, which may minimize thermal impedance and/or facilitate heat transfer from the bus bar assembly 24 to the third pin $184_3$ to the sensor 186. The second layer $194_2$ and/or the one or more additional layers $194_3$ may provide a close thermal coupling to the sensor 186 and/or act as a hot plate to closely match the temperature of the bus bar assembly 24 proximate the circuit board 182 (e.g., the bus bar portions 24A, 24B). In some configurations, the third pin $184_3$ may not be electrically connected to other components. For example and without limitation, the third pin $184_3$ may provide structural support for the circuit board 182 and may facilitate heat transfer to the circuit board 182, and may not be utilized from transferring/transmitting information or signals.

Figure 10B:
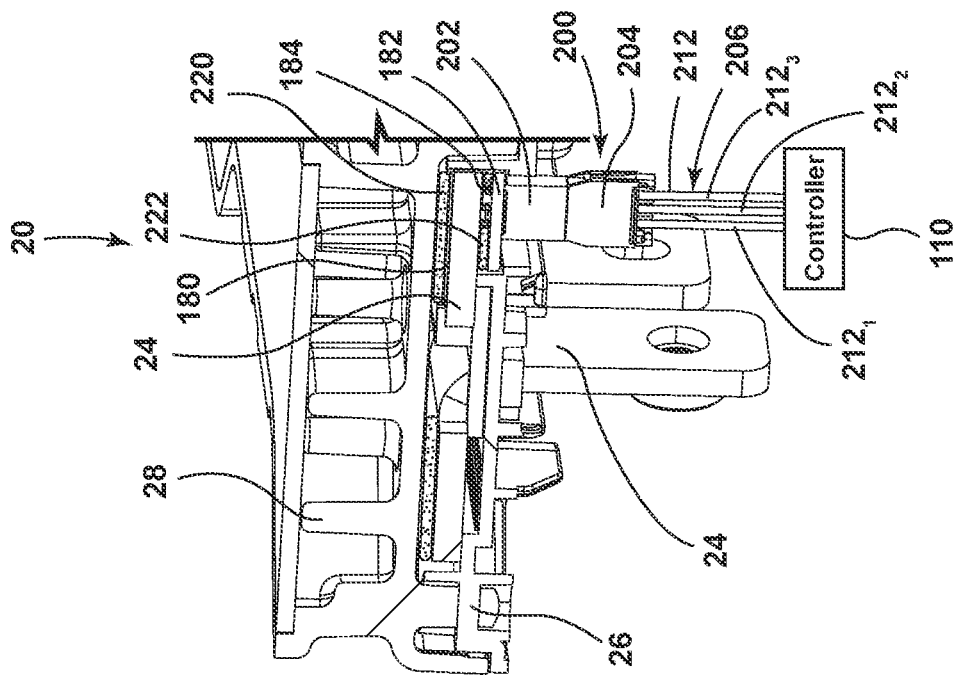
FIG. 10B is a cross-sectional perspective view generally illustrating an embodiment of an electrical assembly.
Figure 10A:
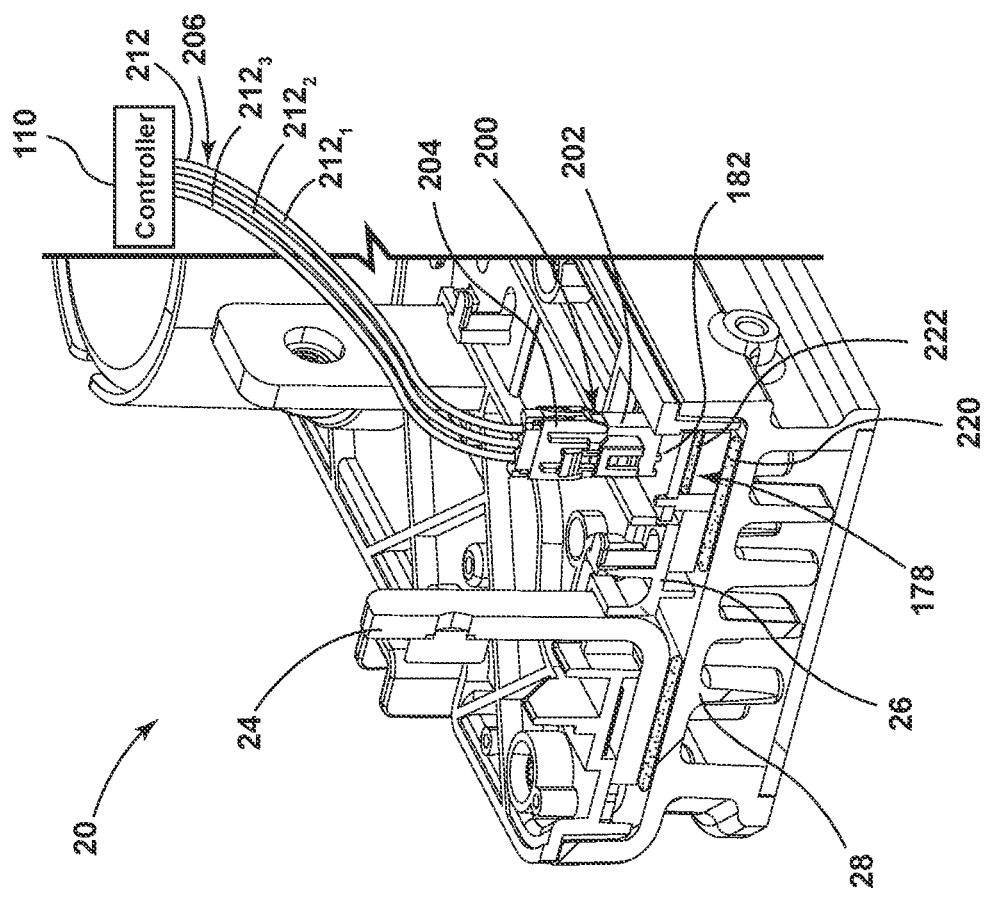
FIG. 10A is a cross-sectional perspective view generally illustrating an embodiment of an electrical assembly.
Figure 11:
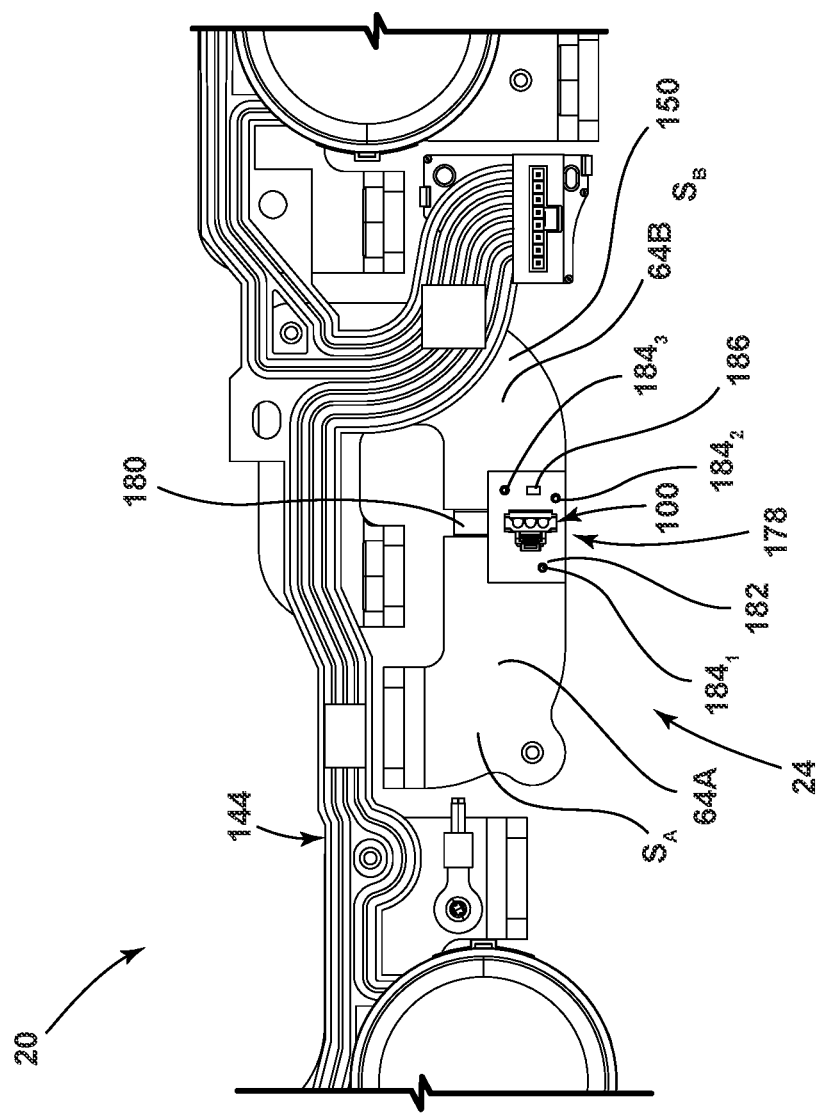
FIG. 11 is a side view generally illustrating an embodiment of a sensor of an electrical assembly.
Figure 14:
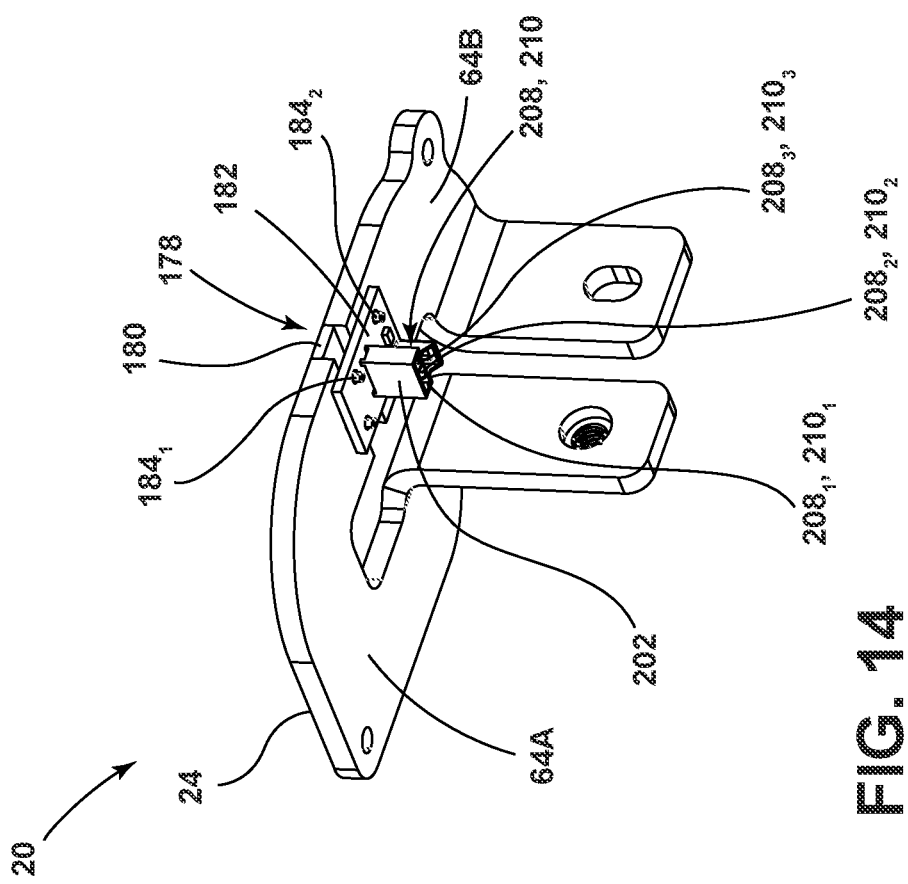
FIGS. 13 and 14 are perspective views generally illustrating embodiments of a sensor of an electrical assembly.
Figure 13:
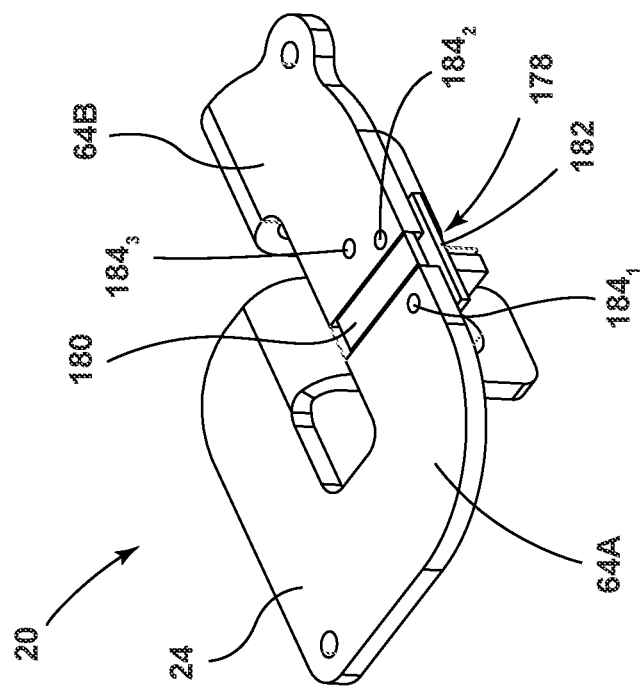

In some example configurations, such as generally illustrated in FIGS. 10A and 10B, an electrical connector 200 may include a first portion 202 (e.g., a socket portion) and/or a second portion 204 (e.g., a plug portion). The first portion 202 may be detachably coupled to the second portion 204 and/or the second portion 204 may be fixed to a wire/cable 206. In some examples, the first portion 202 may be fixed directly (e.g., soldered, glued, etc.) to the circuit board 182. In some configurations, the first portion 202 may include a plurality of sockets 208, such as a first socket $208_1$, a second socket $208_2$, and/or a third socket $208_3$ (see, e.g., FIG. 14). In some examples, the first portion 202 may include a plurality of terminals 210, such as a first terminal $210_1$, a second terminal $210_2$, and/or a third terminal $210_3$. The first terminal $210_1$ may be disposed within the first socket $208_1$, the second terminal $210_2$ may be disposed within the second socket $208_2$, and/or the third terminal $210_3$ may be disposed within the third socket $208_3$. The plurality of terminals 210 may include one or more electrically conductive materials (e.g., metal).

In some embodiments, such as generally illustrated in FIGS. 12A-12C, in an assembled configuration, the first pin $184_1$ may be at least partially disposed in the first aperture $188_1$ of the circuit board 182, the second pin $184_2$ may be at least partially disposed in the second aperture $188_2$ of the circuit board 182, the third pin $184_3$ may be at least partially disposed in the third aperture $188_3$ of the circuit board 182, the first terminal $210_1$ of the first portion 202 may be at least partially disposed in the fourth aperture $188_4$ of the circuit board 182, the second terminal $210_2$ of the first portion 202 may be at least partially disposed in the fifth aperture $188_5$ of the circuit board 182, and/or the third terminal $210_3$ of the first portion 202 may be at least partially disposed in the sixth aperture $188_6$ of the circuit board 182.

In some examples, in an assembled configuration, the first pin $184_1$ may be electrically connected to the first terminal $210_1$ of the first portion 202 via the first electrical trace $196_1$, the second pin $184_2$ may be electrically connected to second terminal $210_2$ of the first portion 202 via the second electrical trace $196_2$ and/or one or more conductor portions $198_{1-2}$, and/or the sensor 186 may be electrically connected to the third terminal $210_3$ of the first portion 202 via the third electrical trace $196_3$. In some example configurations, the first terminal $210_1$ and the second terminal $210_2$ may be connected to the shunt resistor 180 and/or the bus bar portions 24A, 24B, via the first and second pins $184_1$, $184_2$, and/or the second terminal $210_2$ and the third terminal $210_3$ may be connected (e.g., electrically) to the sensor 186 (e.g., the shunt resistor 180 and the sensor 186 may share the second terminal $210_2$ in configurations with three terminals). In other configurations, the first portion 202 may include one or more additional terminals (e.g., a total of four or more terminals) and the shunt resistor 180 and the sensor 186 may utilize separate terminals. In embodiments, the size (e.g., cross-sectional area) of the traces $196_{1-3}$ may be minimized to increase thermal impedance between the sensor assembly 178 and components connected to the sensor assembly 178 (e.g., the wire/cable 206), which may minimize heat transfer to such components and/or from such components, which may facilitate maintaining the temperature (and/or temperature changes) proximate the sensor 186 substantially the same as the shunt resistor 180.

In embodiments, such as illustrated in FIGS. 10A and 10B, a circuit board 182 may be electrically connected to a controller 110, at least in part, via an electrical connector 200 and/or a wire/cable 206. The wire/cable 206 may include a plurality of conductors 212, such as a first conductor $212_1$, a second conductor $212_2$, and/or a third conductor $212_3$. In some instances, a second portion 204 of the electrical connector 200 may be disposed at a terminal end of the wire/cable 206. In an assembled configuration, the second portion 204 may be connected to a first portion 202 of the electrical connector 200, such that the first conductor $212_1$ is electrically connected to the first terminal $210_1$, the second conductor $212_2$ is electrically connected to the second terminal $210_2$, and/or the third conductor $212_3$ is electrically connected to the third terminal $210_3$.

In some embodiments, a controller 110 may be configured to determine an electrical current of the bus bar assembly 24 according, at least in part, to information obtained via the sensor assembly 178. For example, the controller 110 may be configured to determine a voltage drop across a shunt resistor 180 via the first and a second pins $184_{1-2}$ and/or the first and second conductors $212_{1-2}$. A resistance value of the shunt resistor 180 may be stored in and/or accessible to the controller 110. The controller 110 may determine a bus bar current according to the voltage drop divided by the resistance value.

In embodiments, the controller 110 may be configured to adjust the determined bus bar current based on a temperature of and/or proximate the bus bar assembly 24, such as to minimize an impact of and/or compensate for temperature on the determined electrical current (e.g., changes to the resistance value). The controller 110 may determine a temperature of and/or proximate the bus bar portions 24A, 24B via the sensor 186. For example, the controller 110 may obtain the resistance of the sensor 186 and convert the resistance to a temperature (e.g., based on properties of the sensor 186 that may be stored on and/or accessible to the controller 110). The controller 110 may adjust the determined bus bar current according to the determined bus bar temperature. For example, the controller 110 may increase the determined bus bar current when temperatures increase to compensate for increased resistance of the shunt resistor 180. The controller 110 adjusting the calculated electrical current based on the calculated temperature may, at least in part, help facilitate an accurate determination of the electrical current flowing through the bus bar assembly 24.

With embodiments, it may be beneficial to cool the sensor assembly 178, such as to facilitate an accurate determination of the electrical current of the bus bar assembly 24 and/or to help increase an effective current capacity of the sensor assembly 178. In some examples, the cooling member 28 may help, at least in part, cool some or all portions of the sensor assembly 178. For example, the shunt resistor 180 may be thermally connected to the cooling member 28 directly (e.g., via a thermally conductive material 220) and/or via the bus bar assembly 24. In some examples, the bus bar first portion 64A and the bus bar second portion 64B may be disposed in a generally annular or donut-like configuration, which may increase the surface area of the bus bar portions 64A, 64B disposed adjacent the cooling member 28 (e.g., with thermally conductive material 220 therebetween) and increase the heat dissipation/cooling provided by the cooling member 28 to the bus bar portions 24A, 24B. The shunt resistor 180 may be in direct contact with the bus bar portions 64A, 64B, which may facilitate, at least in part, the cooling of the shunt resistor 180.

In embodiments, such as generally illustrated in FIG. 15), the shunt resistor 180 may be disposed at an opposite side of the circuit board 182 (e.g., a first side $216_1$) than the sensor 186 (e.g., a second side $216_2$). For example and without limitation, the shunt resistor 180 may be disposed at a distance from the first side $216_1$ and the sensor 186 may be disposed on and/or fixed to the second side $216_2$. One or more of the plurality of pins 184 (e.g., the second pin $184_2$ and/or the third pin $184_3$) may, at least in part, help draw/transfer heat from the bus bar assembly 24 towards the sensor 186 (e.g., away from the cooling member 28). This may, at least in some examples, expose the sensor 186 to a temperature and/or a change in temperature substantially similar to the temperature or temperature change of the bus bar assembly 24 (e.g., bus bar portions 24A, 24B) and/or the shunt resistor 180. In some instances, the second pin $184_2$, the third pin $184_3$, and/or the conductor portions $198_1$, $198_2$ of the circuit board 182 may cooperate to help facilitate an accurate determination of the temperature of the bus bar assembly 24 via the sensor 186. For example, the second pin $184_2$, the third pin $184_3$, and/or the conductor portions $198_1$, $198_2$ of the circuit board 182 may cooperate to expose the sensor 186 to a temperature substantially similar to the temperature of the bus bar assembly 24.

Figure 16:
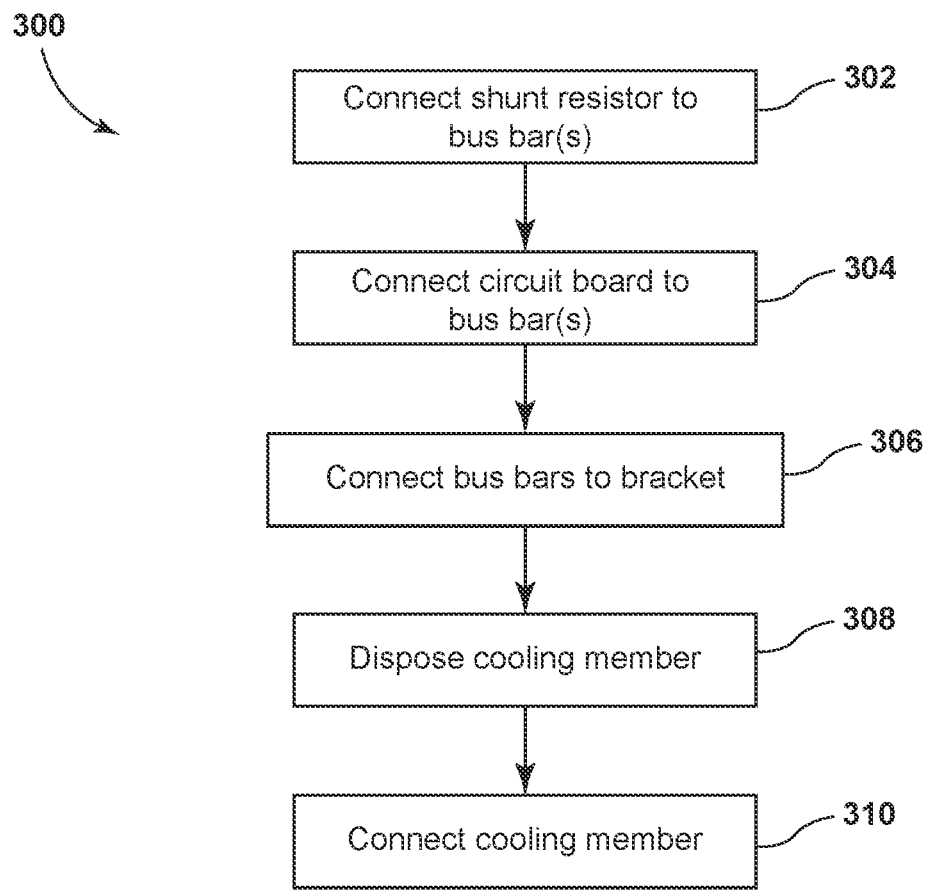
FIG. 16 is a flow diagram generally illustrating an embodiment of assembling an electrical assembly

With embodiments, such as generally illustrated in FIG. 16, a method 300 of assembling an electrical assembly 20 may include connecting a shunt resistor 180 with a bus bar assembly 24 (block 302). In some examples, the shunt resistor 180 may be fixed (e.g., directly) with a bus bar first portion 64A and/or a bus bar second portion 64B of the bus bar assembly 24. In some examples, the method 300 may include connecting a circuit board 182 including a sensor 186 with the bus bar assembly 24 (block 304). In some instances, the plurality of pins 184 (e.g., a first pin $184_1$ and/or a second pin $184_2$) may be fixed (e.g., directly) to the bus bar assembly 24 (e.g., a bus bar first portion 64A and/or a bus bar second portion 64B). The circuit board 182 may be pressed fit to the plurality of pins 184 and, subsequently, the circuit board 182 may be soldered with the plurality of pins 184. In this regard, the plurality of pins 184 may function as an assembly aid (e.g., a poka-yoke) to help facilitate the correct attachment of the circuit board 182 with the bus bar assembly 24.

With embodiments, the method 300 may include connecting the bus bar assembly 24 with the bracket 26, which may include fastening (e.g., fixing) the bus bar assembly 24 with the bracket 26 via one or more second fasteners 122 (block 306). The second fasteners 122 may, for example and without limitation, be inserted/screwed into the bus bar assembly 24 and then down into the bracket 26. Connecting the bus bar assembly 24 with the bracket 26 may (e.g., indirectly) connect the one or more contactors 22 with the bracket 26. The method 300 may include disposing the cooling member 28 on the bracket 26 (block 308), which may include inserting portions of the one or more contactors 22, the bus bar assembly 24, the bracket 26, the flexible circuit 144, and/or the sensor assembly 178 into the cooling member 28, such as into a second recess 78. The method 300 may include connecting the cooling member 28 with the bracket 26 (block 310), which may include fastening (e.g., fixing) the cooling member 28 with the bracket 26 via one or more third fasteners 124. For example and without limitation, the one or more third fasteners 124 may be inserted into the bracket 26 and then up into the cooling member 28.

Figure 17:
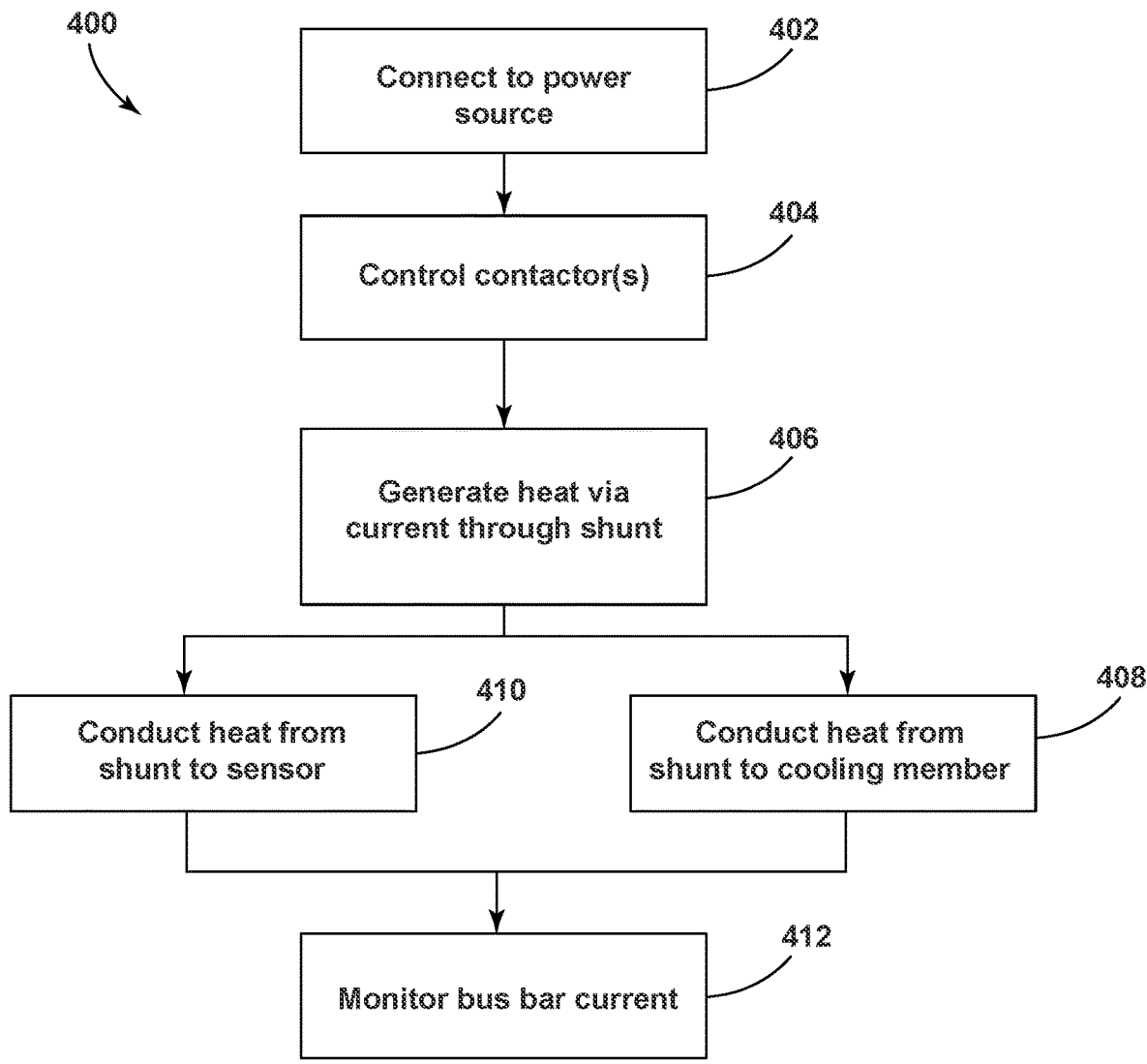
FIG. 17 is a flow diagram generally illustrating an embodiment of operating an electrical assembly.

In embodiments, such as generally illustrated in FIG. 17, a method 400 of operating an electrical assembly 20 may include connecting one or more portions of an electrical assembly 20 to a power source 40 (bock 402). In some configurations, the power source 40 may be included with the electrical assembly 20. Connecting one or more portions of an electrical assembly 20 with a power source 40 may include electrically connecting a bus bar assembly 24 with the power source 40 and/or electrically connecting the bus bar assembly 24 with one or more contactors 22.

With embodiments, the method 300 may include operating the one or more contactors 22 (block 404), such as to selectively provide power to one to more loads 170. For example, the controller 110 may provide control signals to the one or more contactors 22. Operating the one or more contactors 22 may cause/allow current to flow through the bus bar assembly 24 and/or through the bus bar first portion 24A, the bus bar second portion 24B, and a shunt resistor 180, which may cause the shunt resistor 180 to generate heat (block 406). The current may, for example and without limitation, be at least about 500 A, at least about 1000 A, or more or less. The method 400 may include dissipating heat from the shunt resistor 180, such as via conducting heat from the one or more shunt resistor 180 to the cooling member 28, such as directly (e.g., via material 220) and/or via the bus bar portions 24A, 24B (block 408). Dissipating heat from the shunt resistor 180 may allow for the sensor assembly 178 to operate with larger currents than with other methods/configurations (e.g., above a normal current capacity). The method 400 may include conducting heat from the shunt resistor 180 to the sensor 186 (block 410).

With embodiments, the method 400 may include determining and/or monitoring (e.g., via the controller 110) an electrical current of the bus bar assembly 24 (block 412), such as via a sensor assembly 178. Determining and/or monitoring the electrical current (block 412) may include determining a voltage drop across a shunt resistor 180 and dividing the voltage drop by a resistance of the shunt resistor 180 to obtain a bus bar current. In some configurations, the value of the resistance of the shunt resistor 180 may be a static value and the obtained bus bar current may be adjusted (e.g., by the controller 110) according to temperature information obtained via a sensor 186 of the sensor assembly 178 to obtain an adjusted bus bar current. In other configurations, the value of the resistance of the shunt resistor 180 may be adjusted according to the temperature information obtained via the sensor 186 prior to determining the bus bar current (e.g., the controller 110 may provide temperature correction/adjustment to make the determined/adjusted bus bar current more accurate). Obtaining the temperature information may include drawing heat from the bus bar assembly 24 and/or the shunt resistor 180 toward the sensor 186 (block 410), which may be away from the cooling member 28, such as via one or more pins 184, one or more layers 194 of a circuit board 182, and/or thermally conductive material 222 disposed between and/or thermally connecting the circuit board 182, the bus bar assembly 24 (e.g., bus bar portions 24A, 24B), and/or the shunt resistor 180. The sensor assembly 178 may be configured to draw heat toward the sensor 186 and/or away from the cooling member 28 such that the temperature at or about the sensor 186 is substantially the same as the temperature of the shunt resistor 180.

With embodiments, a bracket 26, a first portion 72 of a cooling member 28, and/or a second portion 74 of cooling member 28 may, for example, be formed as monolithic (e.g., single, unitary) components. For example and without limitation, the bracket 26 may be formed as monolithic plastic component, and/or the first portion 72 may be formed as monolithic metal (e.g., aluminum) component.

In examples, a controller (e.g., controller 110) may include an electronic controller and/or include an electronic processor, such as a programmable microprocessor and/or microcontroller. In embodiments, a controller may include, for example, an application specific integrated circuit (ASIC). A controller may include a central processing unit (CPU), a memory (e.g., a non-transitory computer-readable storage medium), and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. Uses of "e.g." and "such as" in the specification are to be construed broadly and are used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

What is claimed is:

1. An electrical assembly, comprising:
a bus bar assembly;
a sensor assembly, including:

a circuit board fixed directly to the bus bar assembly via a plurality of pins; and a sensor, wherein at least one pin from the plurality of pins is inserted within the circuit board to transfer heat from the at least one pin to the sensor;

a bracket connected to the bus bar assembly; and a cooling member connected to the bracket.

2. The electrical assembly of claim 1, wherein the bus bar assembly includes bus bar portions thermally coupled to the circuit board and the cooling member.

3. The electrical assembly of claim 1, wherein the sensor includes a thermistor and is configured to, at least in part, obtain temperature information associated with the bus bar assembly.

4. The electrical assembly of claim 3, wherein the bus bar assembly includes a bus bar first portion and a bus bar second portion connected to the bus bar first portion via a shunt resistor, and the shunt resistor is configured to determine an electrical current flowing through the bus bar assembly.

5. The electrical assembly of claim 4, wherein the shunt resistor is connected to the bus bar first portion and the bus bar second portion via a welded connection.

6. The electrical assembly of claim 4, wherein the plurality of pins includes a first pin connected to the bus bar first portion and a second pin connected to the bus bar second portion.

7. The electrical assembly of claim 6, wherein the plurality of pins includes a third pin, and the second pin and the third pin are configured to conduct heat from the bus bar assembly to the sensor such that a temperature proximate the sensor is substantially the same as a shunt resistor temperature.

8. The electrical assembly of claim 6, wherein the circuit board includes a first aperture and a second aperture, the first pin and the second pin include a first portion having a first diameter and a second portion having a second diameter that is larger than the first diameter, the first portion of the first pin is disposed at least partially in the first aperture, the first portion of the second pin is disposed at least partially in the second aperture, and the circuit board is in contact with the second portions of the first pin and the second pin.

9. The electrical assembly of claim 8, including a third pin, wherein the circuit board is offset from a first surface of the bus bar first portion and a first surface of the bus bar second portion via the second portions of the first pin and the second pin, and the first pin, the second pin, and the third pin are disposed to facilitate alignment of the circuit board relative to the bus bar assembly.

10. The electrical assembly of claim 9, wherein the bus bar first portion and the bus bar second portion are disposed in an annular configuration to facilitate thermal transfer to the cooling member.

11. The electrical assembly of claim 1, wherein the cooling member includes an at least partially hollow body configured to receive a cooling fluid.

12. The electrical assembly of claim 4, wherein the cooling member is connected with the bracket such that shunt resistor is indirectly connected to the cooling member via the bus bar assembly and the bracket.

13. The electrical assembly of claim 3, wherein the circuit board includes a plurality of layers including a first layer, a second layer, and one or more additional layers.

14. The electrical assembly of claim 13, wherein the first layer of the circuit board includes copper, and a shape of the copper of the first layer corresponds to a shape of the sensor.

15. The electrical assembly of claim 14, wherein the second layer includes additional copper that facilitates a thermal transfer from the bus bar assembly to the sensor.

16. The electrical assembly of claim 1, wherein a thermally conductive material is disposed at least partially between the bus bar assembly and the circuit board.

17. A method of assembling the electrical assembly of claim 4, the method comprising:

connecting the shunt resistor with the bus bar assembly;

connecting the circuit board with the bus bar assembly;

connecting the bus bar assembly with the bracket;

disposing the cooling member on or about the bracket; and connecting the cooling member with the bracket.

18. The method of claim 17, wherein connecting the circuit board with the bus bar assembly includes press fitting the plurality of pins with the bus bar assembly, and soldering the circuit board with the plurality of pins.

19. The method of claim 17, wherein disposing the cooling member on the bracket includes inserting the bracket, the circuit board, the bus bar assembly, and the shunt resistor at least partially into a recess of the cooling member.

20. The method of claim 17, wherein the bus bar assembly is fixed directly to the shunt resistor, the bus bar assembly is fixed directly with the bracket, and the cooling member is fixed directly with the bracket.

* * * * *